United States Patent
Jahan et al.

(10) Patent No.: US 7,471,106 B2
(45) Date of Patent: *Dec. 30, 2008

(54) LOW-LEAKAGE LEVEL SHIFTER WITH INTEGRATED FIREWALL AND METHOD

(75) Inventors: Mirza Jahan, Chandler, AZ (US); Noor Sarwar, Chandler, AZ (US)

(73) Assignee: Marvell International Ltd., Hamilton (BM)

(*) Notice: Subject to any disclaimer, the term of this patent is extended or adjusted under 35 U.S.C. 154(b) by 0 days.

This patent is subject to a terminal disclaimer.

(21) Appl. No.: 11/798,602

(22) Filed: May 15, 2007

(65) Prior Publication Data

US 2007/0216442 A1 Sep. 20, 2007

Related U.S. Application Data

(63) Continuation of application No. 11/460,885, filed on Jul. 28, 2006, now Pat. No. 7,342,417, which is a continuation of application No. 10/880,767, filed on Jun. 28, 2004, now Pat. No. 7,129,751.

(51) Int. Cl.
*H03K 19/0175* (2006.01)
(52) U.S. Cl. ............................ 326/68; 326/63; 327/333
(58) Field of Classification Search ................... 326/63, 326/68, 70–72, 83; 327/333
See application file for complete search history.

(56) References Cited

U.S. PATENT DOCUMENTS

| 6,362,653 | B1 | 3/2002 | Coughlin et al. | |
| 6,501,298 | B1 | 12/2002 | Terletzki | |
| 6,753,698 | B2* | 6/2004 | Carpenter et al. | 326/83 |
| 2005/0285623 | A1 | 12/2005 | Jahan et al. | |

* cited by examiner

*Primary Examiner*—Daniel D Chang

(57) ABSTRACT

A level shifter may reduce leakage current and provide firewall protection between circuits of different voltage domains when one voltage domain is in a standby mode. The level shifter may either couple or decouple input circuitry from a reference voltage in response to a firewall enable signal, may translate signal having a predetermined one of either a high or low state when the firewall enable signal is asserted.

35 Claims, 4 Drawing Sheets

LOW-LEAKAGE LEVEL SHIFTER WITH INTEGRATED FIREWALL AND METHOD

INCORPORATION BY REFERENCE

This application is a continuation of U.S. patent application Ser. No. 11/460,885, filed Jul. 28, 2006, which in turn is a continuation of application Ser. No. 10/880,767 filed Jun. 28, 2004, now U.S. Pat. No. 7,129,751. The disclosures of the prior applications are hereby incorporated by reference herein in their entirety.

TECHNICAL FIELD

Embodiments of the present invention pertain to electronic circuits. Some embodiments of the present invention pertain to integrated circuits and level shifting circuits. Some embodiments pertain to wireless communication devices.

BACKGROUND

Modern semiconductor processing technology has advanced rapidly with increased transistor density, reduced chip area and improved transistor performance. In many cases, these advancements have come at the expense of increased leakage current. In the past, this leakage current has been small in comparison to the total chip power; however with advancing technologies, leakage current is becoming an increasingly larger percentage. Part of the reason for this increase in leakage current is that many newer technologies rely more on high-leakage semiconductor devices, which may have shorter channel lengths, thinner gate-oxide layers and/or lower threshold voltages than semiconductor devices of more conventional processing technologies.

This increasing leakage current is especially a concern for systems and devices that rely heavily on batteries, such as wireless communication devices. Such systems and devices may utilize a standby mode to reduce their power consumption. During standby mode, many active components of one or more voltage domains are powered down; however invalid data signals generated by circuitry of a voltage domain in the standby mode may result in an increased leakage current by other circuitry.

Level shifters are generally used to shift data signals from one voltage domain to another. One problem with some conventional level shifters is that invalid data signals may be generated during the standby mode causing an increase in leakage current in either the level-shifter circuitry itself and/or other circuitry. Thus, there are general needs for level shifters that provide firewall protection to help prevent the generation of invalid data signals and level shifters that help reduce leakage current in standby mode.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice the invention. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. Embodiments of the invention set forth in the claims encompass all available equivalents of those claims. Embodiments of the invention may be referred to, individually or collectively, herein by the term "invention" merely for convenience and without intending to voluntarily limit the scope of this application to any single invention or inventive concept if more than one is in fact disclosed.

Figure 1:
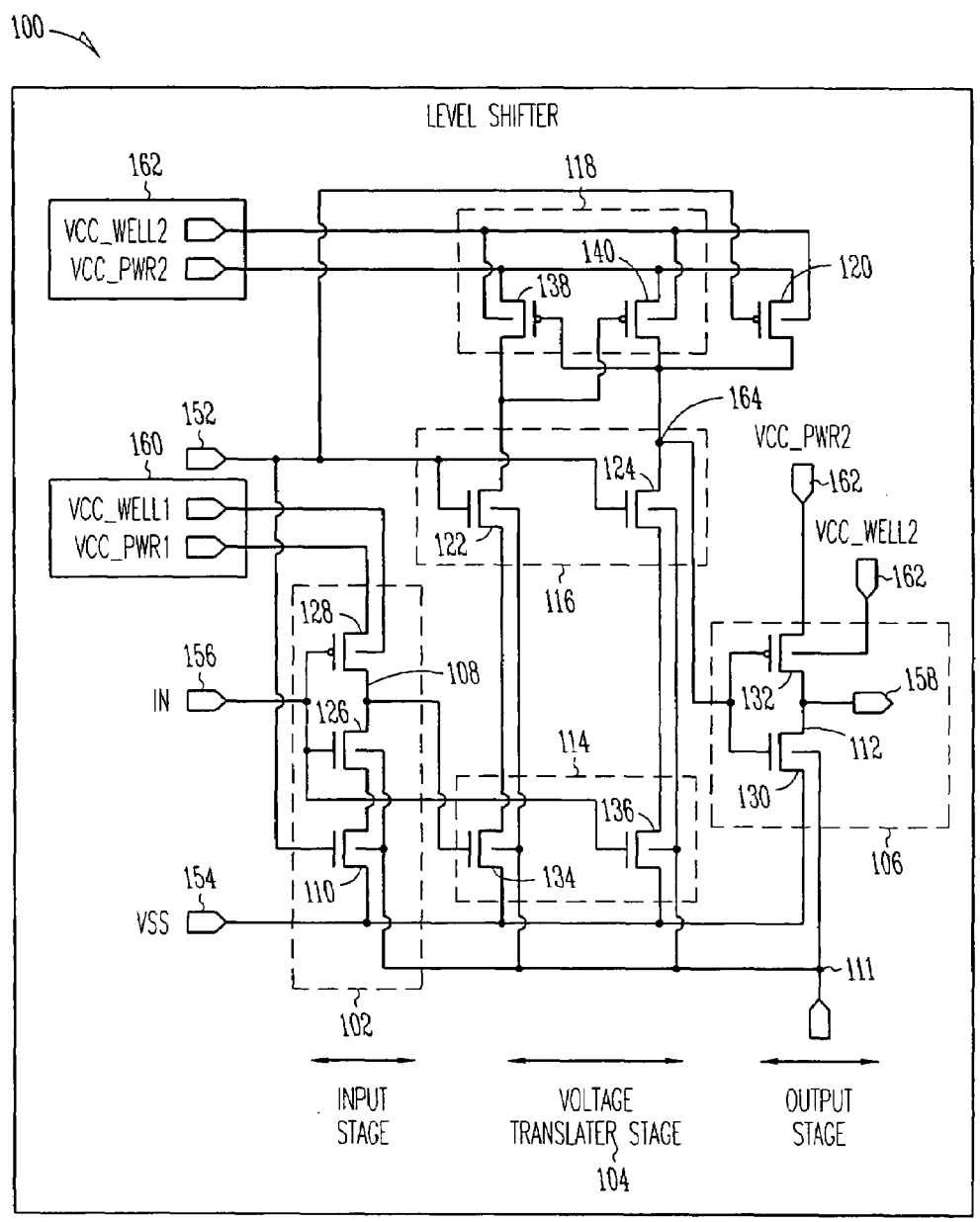
FIG. 1 is a circuit diagram of a level shifter in accordance with some embodiments of the present invention.

FIG. 1 is a circuit diagram of a level shifter in accordance with some embodiments of the present invention. Level shifter 100 may be used to translate an input signal at node 156 from a first voltage domain to an output signal at node 158 of a second voltage domain during an active (i.e., a non-standby) mode of operation. During a standby mode, level shifter 100 may isolate an input signal at node 156 from an output signal at node 158 in response to the assertion of firewall enable signal 152. During the standby mode, leakage current may be reduced through the operation of circuitry described in more detail below.

In accordance with some embodiments of the present invention, level shifter 100 may comprise input stage 102 to receive input signals at node 156, voltage translator stage 104 to translate the input signals from the first voltage domain to the second voltage domain, and output stage 106 to generate output signals at node 158. In accordance with some embodiments, input stage 102 comprises input circuitry 108 and input stage firewall switching element 110. Input stage firewall switching element 110 may either couple or decouple input circuitry 108 from reference voltage 154 in response to firewall enable signal 152. Voltage translator stage 104 may comprise firewall assertion switching element 120 to cause the level shifter 100 to generate an output signal at node 158 having a predetermined state (i.e., either a high or low state) when firewall enable signal 152 is asserted.

In accordance with some embodiments, when firewall enable signal 152 is asserted, input stage firewall switching element 110 may decouple input circuitry 108 from reference voltage 154 to help reduce and/or eliminate any leakage current in input circuitry 108. In some embodiments, input stage firewall switching element 110 is optional.

In accordance with some embodiments, output stage 106 comprises output circuitry 112 to provide an output signal at node 158, which may be referenced to the second voltage domain. Firewall assertion switching element 120 may assert a predetermined signal level at node 164 to cause output stage 106 to generate an output signal at node 158 having the predetermined state when firewall enable signal 152 is asserted. In some embodiments, firewall enable signal 152 may be an active low signal and output signal 158 may be at a solid low state when firewall enable signal 152 is asserted (i.e., with a low state), although the scope of the invention is not limited in this respect. In some embodiments, firewall enable signal 152 is a signal of the second voltage domain, although the scope of the invention is not limited in this respect.

In some embodiments, voltage translator stage 104 translates an input signal at node 156, which may be referenced to the first voltage domain, to an intermediate output signal at node 164, which may be referenced to the second voltage domain. Firewall assertion switching element 120 may be a pull-up switching element to cause level shifter 100 to generate an output signal at node 158 from an intermediate output signal at node 164. In these embodiments, the output signal at node 158 may be a solid low state when firewall enable signal 152 is asserted with a low, although the scope of the invention is not limited in this respect.

In accordance with some embodiments, voltage translator stage 104 may further comprise data signal switching elements 114, firewall switching elements 116, and voltage translation switching elements 118. Firewall switching elements 116 may couple data signal switching elements 114 to voltage translation switching elements 118 when firewall enable signal 152 is deasserted (i.e., is not asserted). In accordance with some embodiments, when firewall enable signal 152 is asserted, firewall switching elements 116 may decouple data signal switching elements 114 from voltage translation switching elements 118 to reduce leakage current in voltage translation switching elements 118. In accordance with some embodiments, when firewall enable signal 152 is asserted, input stage switching element 110 may also decouple input circuitry 108 from reference voltage 154 to reduce leakage current in input circuitry 108. In some embodiments, when firewall enable signal 152 is asserted, leakage current in voltage translation switching elements 118 and leakage current in input circuitry 108 may be substantially eliminated.

In accordance with some embodiments, voltage translation switching elements 118 may be a latch comprising back-to-back coupled transistors 138 and 140, and data signal switching elements 114 may couple data signals from input stage 102 to output stage 106. In some embodiments, input circuitry 108 may be coupled to first supply voltage 160 which may be used to power circuitry external to level shifter 100 of the first voltage domain, and output circuitry 112 may be coupled to second supply voltage 162 which may be used to power circuitry external to level shifter 100 of the second voltage domain. In some embodiments, reference voltage 154 (Vss) may be a ground voltage, although the scope of the invention is not limited in this respect.

In some embodiments, the first substrate connection (e.g., Vcc_well_1) may be coupled to first supply voltage 160 and the second substrate connection (e.g., Vcc_well_2) may be coupled to second supply voltage 162. In some embodiments, substrate connection 111 may be coupled to second supply voltage 162, although the scope of the invention is not limited in this respect. In some embodiments, the substrate connection for switching element 110 may depend on the voltage domain of the circuitry that generates the firewall enable signal.

In some embodiments, input stage firewall switching element 110 may comprise a low-leakage-current metal-oxide semiconductor (MOS) field effect transistor (FET), firewall switching elements 116 may comprise low-leakage-current MOSFETs 122, 124, and firewall assertion switching element 120 may comprise a low-leakage-current MOSFET, although the scope of the invention is not limited in this respect. In some embodiments, input stage firewall switching element 110 may comprise a high-threshold-voltage, low-leakage-current MOSFET, firewall switching elements 116 may comprise high-threshold-voltage, low-leakage-current MOSFETs and firewall assertion switching element 120 may comprise a high-threshold-voltage, low-leakage-current MOSFET, although the scope of the invention is not limited in this respect. In some embodiments, input stage firewall switching element 110 may comprise an N-channel MOSFET, translator stage firewall switching elements 122, 124 may comprise N-channel MOSFETs, and firewall assertion switching element 120 may comprises a P-channel MOSFET, although the scope of the invention is not limited in this respect.

In some embodiments, input stage circuitry 108 may be an input inverter comprising high-leakage-current MOSFETs 126 and 128, and output stage circuitry 112 may be an output inverter comprising low-leakage-current MOSFETs 130 and 132. In some embodiments, data signal switching elements 114 may comprise high-leakage-current MOSFETs 134 and 136. In some embodiments, voltage translation switching elements 118 may comprise low-leakage-current MOSFETs 138 and 140. In some embodiments, MOSFET 126 and 128 may be low-threshold-voltage, high-leakage-current MOSFETs, and MOSFET 130 and 132 may be high-threshold-voltage, low-leakage-current MOSFETs, although the scope of the present invention is not limited in this respect. In some embodiments, MOSFETs 134 and 136 may be low-threshold-voltage, high-leakage-current MOSFETs. In some embodiments, MOSFETs 138 and 140 may be high-threshold-voltage, low-leakage-current MOSFETs, although the scope of the present invention is not limited in this respect. In some embodiments, MOSFETs 126, 130, 134 and 136 may be N-channel MOSFETs and MOSFETs 128, 132, 138 and 140 may be P-channel MOSFETs, although the scope of the present invention is not limited in this respect.

Low-leakage devices and/or high-threshold-voltage devices may have, for example, a longer channel length, a thicker gate-oxide layer and/or a higher threshold voltage than high-leakage devices and/or low-threshold-voltage devices depending on the particular process technology utilized, although the scope of the invention is not limited in this respect.

In some embodiments, the MOSFETs may comprise low-leakage complementary metal-oxide semiconductor (CMOS) devices, although the scope of the invention is not limited in this respect. Although some embodiments are described as using MOSFETs, other FETs and transistor technologies may also be suitable. Embodiments of the present invention may be applicable to almost any technology or mix of technologies, including technologies in which some devices have a relatively higher leakage and other devices have a relatively lower leakage. Examples of some suitable technologies include bipolar technologies and Gallium-Arsenide (GaAs) technologies, although the scope of the invention is not limited in this respect. In some embodiments, silicon-on-insulator (SOI) technology may be used.

In some embodiments, the first voltage domain may be substantially a 1.2v voltage domain, and the second voltage domain may be substantially a 1.8v voltage domain. In some other embodiments, the first voltage domain may be substantially a 1.8v voltage domain, and the second voltage domain is substantially a 1.2v voltage domain. Other voltages are also suitable, and the scope of the invention is not limited to voltage domains of 1.2 and 1.8volts. For example, voltages domains may include a 1.5v voltage domain, a 2.2v voltage domain, as well as negative voltage domains.

Figures 2, 3:
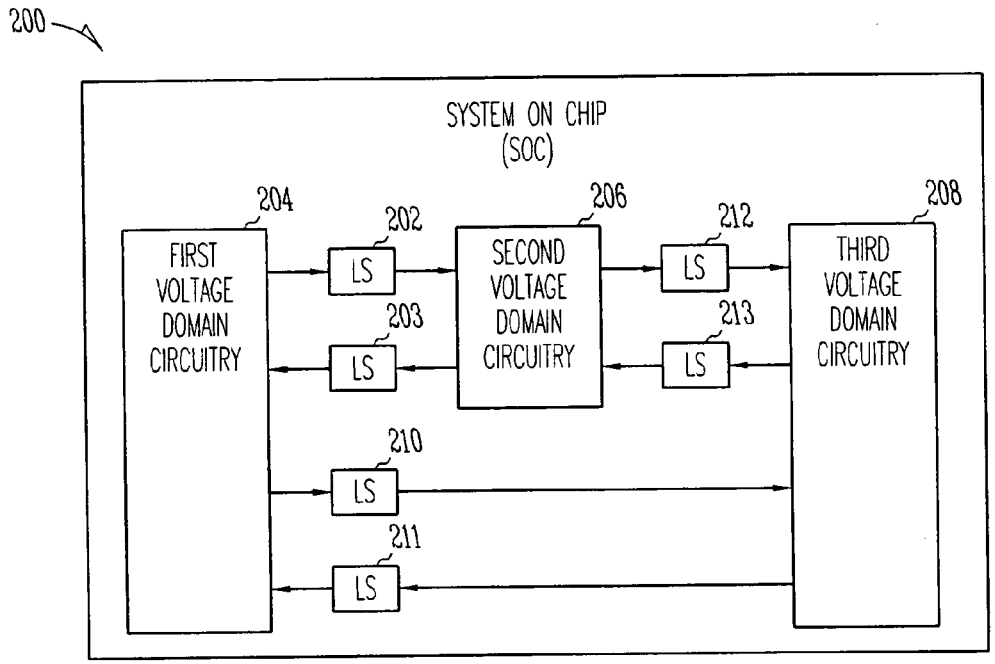
FIG. 2 is a block diagram of a system on a chip in accordance with some embodiments of the present invention.
FIG. 3 is a block diagram of a system on a chip in accordance with some other embodiments of the present invention.

FIG. 2 is a block diagram of a system on a chip in accordance with some embodiments of the present invention. In some embodiments, system on a chip (SOC) 200 comprises circuitry 204 that operates in a first voltage domain (e.g., operates from a first supply voltage or rail), and circuitry 206 that operates in a second voltage domain (e.g., operates from a second supply voltage or rail). System 200 may also include one or more level shifters (LS) 202 & 203 with integrated firewalls to translate signals between the first and second voltage domain circuitries. The one or more level shifters may help reduce leakage current and provide firewall protection between circuits of different voltage domains when one voltage domain is in a standby mode. Level shifter 100 (FIG. 1) is an example of suitable level shifter that may be used for one or more level shifters 202 & 203, although other level shifters may also be used.

In some embodiments, circuitry 204 may be in a standby mode and may not be receiving the first supply voltage. During the standby mode, level shifter 202 may receive a firewall enable signal and may generate an output having a predetermined state for circuitry 206. Likewise, when circuitry 206 is in a standby mode, level shifter 203 may receive a firewall enable signal and may generate an output having a predetermined state for circuitry 204.

In some embodiments, system 200 may comprise circuitry of additional voltage domains, such as circuitry 208 that operates in a third voltage domain. In these embodiments, additional level shifters, such as level shifters 210, 211, 212 & 213, may be provided to shift data signals between the various voltage domain circuitries. Level shifter 100 (FIG. 1) may also be suitable for use as any one or more of level shifters 210, 211, 212 & 213, although the scope of the invention is not limited in this respect.

In some embodiments, rather that providing level shifters between the various voltage domain circuitries, level shifters may be used to level shift data signals to primarily a single voltage domain. In some embodiments, at least first voltage domain circuitry 204, second voltage domain circuitry 206 and level shifters 202 and 203 are fabricated on a single integrated circuit.

FIG. 3 is a block diagram of a system on a chip in accordance with some other embodiments of the present invention. System on a chip (SOC) 300 comprises circuitries 302, 304, 306, 308 and 312, and level shifters 310. In these embodiments, circuitries 302, 304, 306 and 308 may operate in one or more differing voltage domains. Level shifters 310 may level shift data signals between circuitries 302, 304, 306 and 308 and circuitry 312, which may operate in yet a different voltage domain than circuitries 302, 304, 306 and 308. Level shifter 100 (FIG. 1) may be suitable for use as any one or more of level shifters 310. In some embodiments, circuitry 312 may operate on the level-shifted signals received from circuitries 302, 304, 306 and 308 and may generate signals for circuitries 302, 304, 306 and 308, although the scope of the invention is not limited in this respect. In some embodiments, system 300 may allow the placement of level shifters 310 in an input/output (I/O) ring, although the scope of the invention is not limited in this respect.

Figure 4:
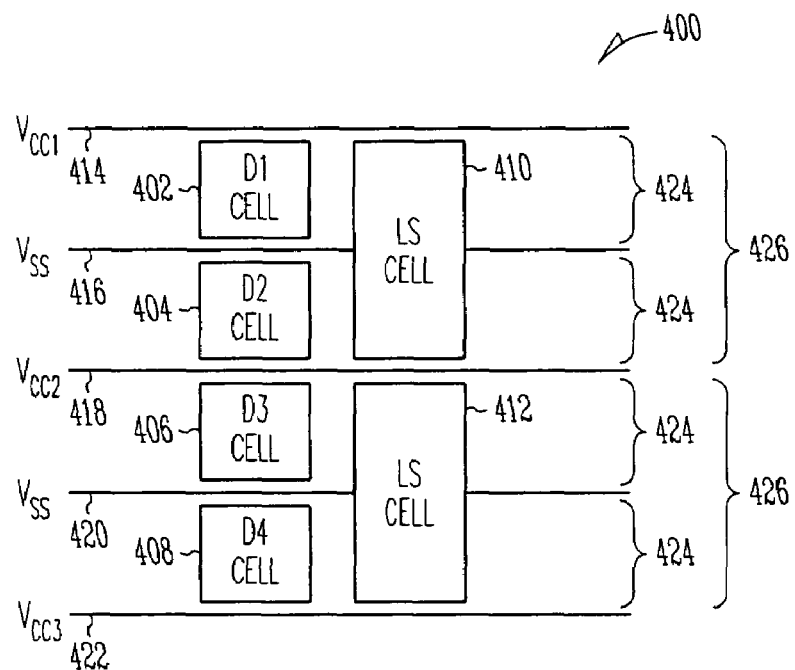
FIG. 4 is a simplified layout diagram of a system on a chip in accordance with some embodiments of the present invention.

FIG. 4 is a simplified layout diagram of a system on a chip in accordance with some embodiments of the present invention. System on a chip (SOC) 400 may illustrate an example of a layout for some of cells system 200 (FIG. 2) and/or system 300 (FIG. 3). System 400 includes circuitry 402 of a first voltage domain, which may receive a first voltage from supply voltage rail 414 and reference voltage rail 416. System 400 also includes circuitry 404 of a second voltage domain, which may receive a second voltage from supply voltage rail 418 and reference voltage rail 416. In these embodiments, one or more level shifters 410 may be provided to level shift signals between circuitry 402 and 404. Level shifters 410 may receive a first voltage from supply voltage rail 414, may receive a second voltage from supply voltage rail 418 and may receive a reference voltage from rail 416. In these embodiments, one rail (either rail 414 or 418) may be the driving side (i.e., input) rail and the other may be the receiving side (i.e., output) rail.

System 400 may also include circuitry 406 of the second voltage domain, which may receive a second voltage from supply voltage rail 418 and reference voltage rail 420. System 400 may also include circuitry 408 of a third voltage domain, which may receive a third voltage from supply voltage rail 422 and a reference voltage from rail 420. In these embodiments, one or more level shifters 412 may be provided to level shift signals between circuitry 406 and 408. Level shifters 412 may receive the second voltage from supply voltage rail 418, may receive the third voltage from supply voltage rail 422 and may receive a reference voltage from rail 420. In these embodiments, one rail (either rail 418 or 422) may be the driving side (i.e., input) rail and the other may be the receiving side (i.e., output) rail.

In some embodiments, circuitries 402, 404, 406 and 408 may comprise cells having predetermined cell height 424 to allow for placement between rails. In some embodiments, level shifters 410 and 412 may also have predetermined cell height 426, which may be substantially double cell height 424. These embodiments may allow rails 416 and 420 carrying a reference voltage (e.g., ground) to be approximately in the middle of the level shifter cells, although the scope of the invention is not limited in this respect. In some embodiments, system 400 may allow the placement of level shifters in an input/output (I/O) ring, although the scope of the invention is not limited in this respect. In some embodiments, the double height configuration of the level shifters may significantly ease placement issues with these cells by an automated place and routing (APR) engine.

Figure 5:
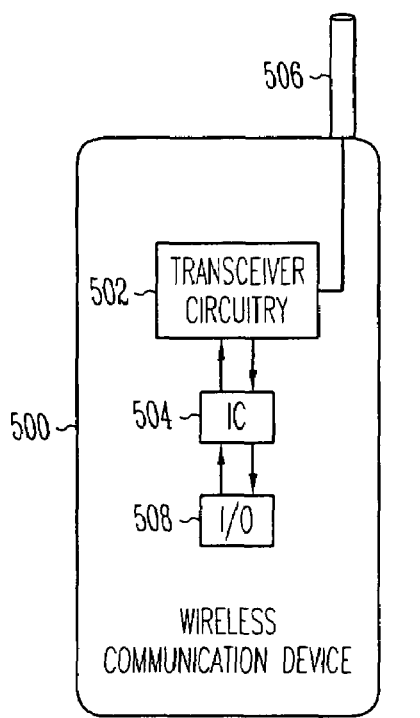
FIG. 5 is a block diagram of a wireless communication device in accordance with embodiments of the present invention.

FIG. 5 is a block diagram of a wireless communication device in accordance with embodiments of the present invention. Wireless communication device 500 may comprise transceiver circuitry 502 and antenna 506 to communicate radio frequency (RF) signals over a communication channel. In some embodiments, transceiver circuitry 502 may be a multicarrier transceiver for communicating multicarrier communication signals, such as orthogonal frequency division multiplexed (e.g., OFDM) communication signals or discrete multitone (DMT) signals over a multicarrier communication channel.

Wireless communication device 500 may also comprise integrated circuitry (IC) 504 to communicate digital data signals with transceiver circuitry 502. In some embodiments, system 200 (FIG. 2) and/or system 300 (FIG. 3) and/or system 400 (FIG. 4) may be used for integrated circuitry 504. Wireless communication device 500 may also comprise input/output (I/O) 508.

In some embodiments, the multicarrier communication channel may comprise a plurality of orthogonal subcarriers. In some embodiments, the orthogonal subcarriers may be closely spaced OFDM subcarriers. To achieve orthogonality between closely spaced subcarriers, in some embodiments, the subcarriers of a particular channel may have a null at substantially a center frequency of the other subcarriers of that channel, although the scope of the invention is not limited in this respect.

In some embodiments, the frequency spectra for the multicarrier communication channel may comprise either a 5 GHz frequency spectrum or a 2.4 GHz frequency spectrum. In these embodiments, the 5 GHz frequency spectrum may include frequencies ranging from approximately 4.9 to 5.9 GHz, and the 2.4 GHz spectrum may include frequencies ranging from approximately 2.3 to 2.5 GHz, although the scope of the invention is not limited in this respect, as other frequency spectrums are equally suitable.

In some embodiments, wireless communication device 500 may be a personal digital assistant (PDA), a laptop or portable computer with wireless communication capability, a web tablet, a wireless telephone, a wireless headset, a pager, an instant messaging device, a digital camera, an access point or other device that may receive and/or transmit information wirelessly. In some wireless communication device 500 may transmit and/or receive RF communications in accordance with specific communication standards, such as the Institute of Electrical and Electronics Engineers (IEEE) standards including IEEE 802.11(a), 802.11(b), 802.11(g/h) and/or 802.11(n) standards for wireless local area networks (WLANS) and/or 802.16 standards for wireless metropolitan area networks (WMANs), although device 500 may also be suitable to transmit and/or receive communications in accordance with other techniques including the Digital Video Broadcasting Terrestrial (DVB-T) broadcasting standard, and the High performance radio Local Area Network (HiperLAN) standard.

Antenna 506 may comprise one or more of a directional or omnidirectional antenna, including, for example, a dipole antenna, a monopole antenna, a loop antenna, a microstrip antenna or other type of antenna suitable for reception and/or transmission of RF signals.

Although some embodiments of the present invention are discussed in the context of an 802.11x implementation (e.g., 802.11a, 802.11g, 802.11 HT, etc.), the scope of the present invention is not limited in this respect. Some embodiments of the present invention may be implemented as part of any wireless system using multicarrier wireless communication channels (e.g., orthogonal frequency-division multiplexing (OFDM), discrete multi-tone modulation (DMT), etc.), such as may be used within, without limitation, a wireless personal area network (WPAN), a wireless local area network (WLAN), a wireless metropolitan are network (WMAN), a wireless wide area network (WWAN), a cellular network, a third generation (3G) network, a fourth generation (4G) network, a universal mobile telephone system (UMTS), and the like communication systems.

Although wireless communication device 500 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), and combinations of various hardware and logic circuitry for performing at least the functions described herein.

Figure 6:
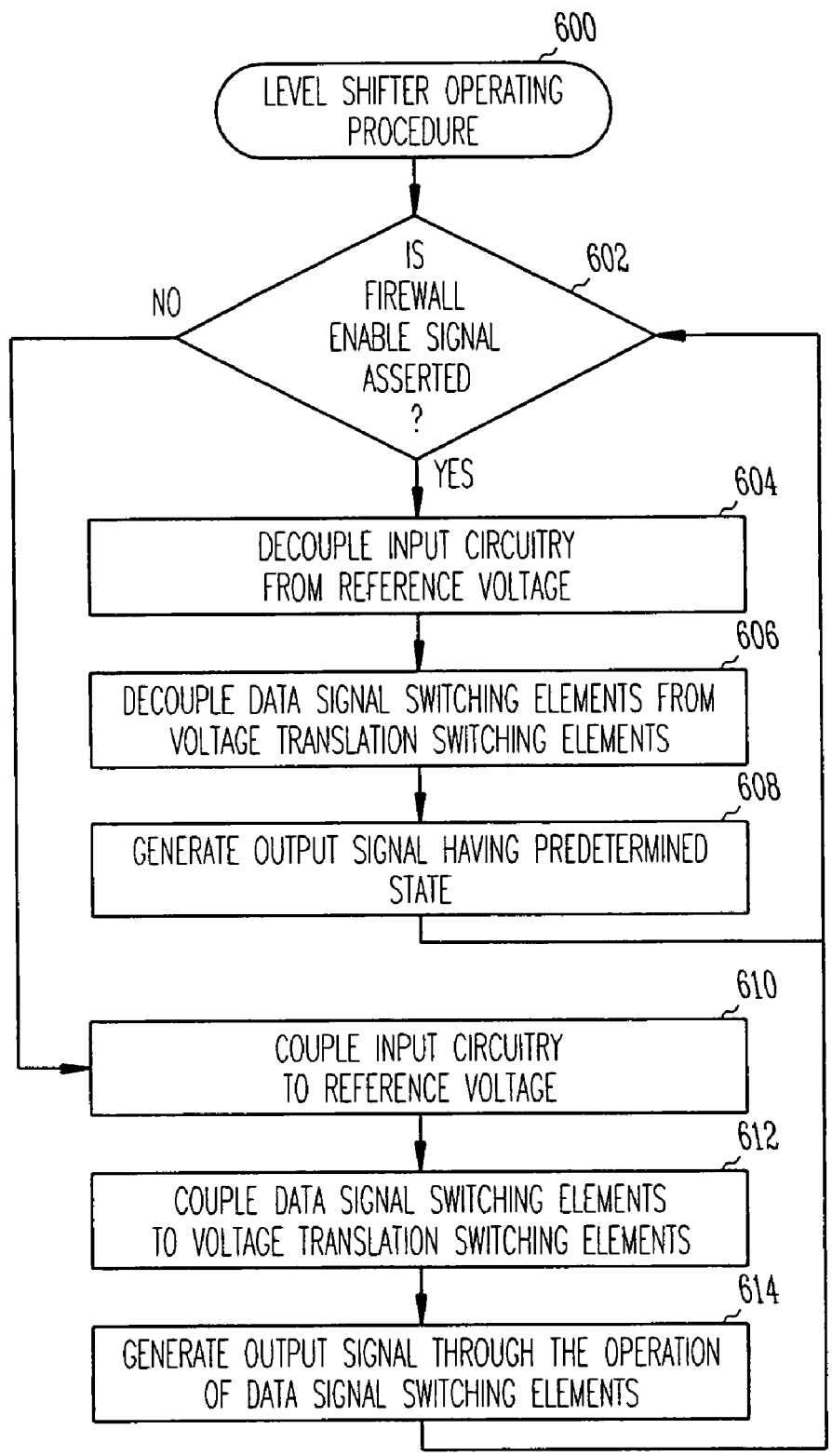
FIG. 6 is flow chart of a level shifter operating procedure in accordance with some embodiments of the present invention.

FIG. 6 is flow chart of a level shifter operating procedure in accordance with some embodiments of the present invention. Level shifter operating procedure 600 may be performed by a level shifter, such as level shifter 100 (FIG. 1), although other level shifters may also be suitable for use in performing procedure 600.

In operation 602, a firewall enable signal may be received. When the firewall enable signal is asserted, operations 604 through 608 may be performed. When the firewall enable signal is deasserted, operation 610 through 614 may be performed.

Operation 604 comprises decoupling input circuitry from a reference voltage. In some embodiments, input stage firewall switching element 110 (FIG. 1) may decouple input circuitry 108 (FIG. 1) from reference voltage 154 (FIG. 1) in response to firewall enable signal 152 (FIG. 1).

Operation 606 comprises decoupling data signal switching elements from voltage translation switching elements. In some embodiments, firewall switching elements 116 (FIG. 1) may decouple data signal switching elements 114 (FIG. 1) from voltage translation switching elements 118 (FIG. 1) to reduce leakage current in voltage translation switching elements 118 (FIG. 1).

Operation 608 comprises generating an output signal having a predetermined state. In some embodiments, firewall assertion switching element 120 (FIG. 1) may cause the level shifter 100 (FIG. 1) to generate the output signal 158 having a predetermined one of either a high or low state when the firewall enable signal 152 (FIG. 1) is asserted. In some embodiments, input stage firewall switching element 110 may decouple the input circuitry 108 (FIG. 1) from the reference voltage 154 to reduce leakage current in input circuitry 108 (FIG. 1).

Operation 610 comprises coupling input circuitry to the reference voltage. In some embodiments, input stage firewall switching element 110 (FIG. 1) may couple input circuitry 108 (FIG. 1) to reference voltage 154 (FIG. 1) in response to deassertion of firewall enable signal 152 (FIG. 1).

Operation 612 comprises coupling the data signal switching elements to the voltage translation switching elements. In some embodiments, firewall switching elements 116 (FIG. 1) may couple data signal switching elements 114 (FIG. 1) to voltage translation switching elements 118 (FIG. 1).

Operation 614 comprises generating an output signal through the operation of the data signal switching elements based on an input signal. In some embodiments, data signal switching elements 114 (FIG. 1) and output circuitry 112 (FIG. 1) may generate output signal 158 (FIG. 1).

Although the individual operations of procedure 600 are illustrated and described as separate operations, one or more of the individual operations may be performed concurrently, and nothing requires that the operations be performed in the order illustrated. For example, in response to assertion of a firewall enable signal, operations 604, 606 and 608 may be performed substantially concurrently. For example, in response the deassertion of the firewall enable signal, operations 610, 612 and 614 may be performed substantially concurrently.

Unless specifically stated otherwise, terms such as processing, computing, calculating, determining, displaying, or the like, may refer to an action and/or process of one or more processing or computing systems or similar devices that may manipulate and transform data represented as physical (e.g., electronic) quantities within a processing system's registers and memory into other data similarly represented as physical quantities within the processing system's registers or memories, or other such information storage, transmission or display devices. Furthermore, as used herein, computing device includes one or more processing elements coupled with computer-readable memory that may be volatile or non-volatile memory or a combination thereof.

Embodiments of the invention may be implemented in one or a combination of hardware, firmware and software. Embodiments of the invention may also be implemented as instructions stored on a machine-readable medium, which may be read and executed by at least one processor to perform the operations described herein. A machine-readable medium may include any mechanism for storing or transmitting information in a form readable by a machine (e.g., a computer). For example, a machine-readable medium may include read-only memory (ROM), random-access memory (RAM), magnetic disk storage media, optical storage media, flash-memory devices, electrical, optical, acoustical or other form of propagated signals (e.g., carrier waves, infrared signals, digital signals, etc.), and others.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, invention may lie in less than all features of a single disclosed embodiment. Thus the following claims are hereby incorporated into the detailed description, with each claim standing on its own as a separate preferred embodiment.

What is claimed is:

1. A level shifter with integrated firewall comprising:
an input stage for receiving input data, including input circuitry and an input stage firewall switching element, the input stage firewall switching element controlling coupling between the input circuitry and a reference voltage in response to a firewall enable signal; and
a voltage translator stage to translate signals between a first voltage domain and a second voltage domain, the voltage translator stage including a firewall assertion switching element to cause the level shifter to generate an output signal having a predetermined one of either a high or low state that is independent of the input data when the firewall enable signal is asserted.

2. The level shifter of claim 1, wherein when the firewall enable signal is asserted, the input stage firewall switching element decouples the input circuitry from the reference voltage to reduce leakage current in the input circuitry.

3. The level shifter of claim 1, further comprising:
an output stage including output circuitry to provide the output signal referenced to the second voltage domain, wherein the firewall assertion switching element asserts a predetermined signal level at an intermediate node to cause the output stage to generate the output signal having the predetermined one of either a high or low state when the firewall enable signal is asserted.

4. The level shifter of claim 1, wherein the voltage translator stage translates signals between the first voltage domain and the second voltage domain when the firewall enable signal is deasserted, and
wherein the voltage translator stage further includes firewall switching elements to couple data signal switching elements to voltage translation switching elements when the firewall enable signal is deasserted.

5. The level shifter of claim 4, wherein when the firewall enable signal is asserted, the firewall switching elements decouple the data signal switching elements from the voltage translation switching elements to reduce leakage current in the voltage translation switching elements, and
wherein when the firewall enable signal is asserted, the input stage firewall switching element decouples the input circuitry from the reference voltage to reduce leakage current in the input circuitry.

6. The level shifter of claim 4, wherein the voltage translation switching elements include back-to-back coupled transistors, and
wherein the data signal switching elements couple data signals from the input stage to an output stage.

7. The level shifter of claim 4, wherein the input stage firewall switching element includes a high-threshold-voltage, low-leakage-current metal-oxide semiconductor (MOS) field effect transistor (FET),
wherein the firewall switching elements include high-threshold-voltage, low-leakage-current MOSFETs, and
wherein the firewall assertion switching element includes a high-threshold-voltage, low-leakage-current MOSFET.

8. The level shifter of claim 7, wherein the input stage firewall switching element includes an N-channel MOSFET, the translator stage firewall switching elements include N-channel MOSFETs, and the firewall assertion switching element includes a P-channel MOSFET.

9. The level shifter of claim 7, wherein the input circuitry is an input inverter including N-channel and P-channel low-threshold-voltage, high-leakage-current MOSFETs, and
an output circuitry is an output inverter including N-channel and P-channel high-threshold-voltage, low-leakage-current MOSFETs.

10. The level shifter of claim 7, wherein the data signal switching elements include N-channel low-threshold-voltage, high-leakage-current MOSFETs, and
wherein the voltage translation switching elements include P-channel high-threshold-voltage, low-leakage-current MOSFETs.

11. The level shifter of claim 9, wherein the high-threshold-voltage, low-leakage-current MOSFETs have at least one of either a longer channel length or a thicker gate-oxide layer than the low-threshold-voltage, high-leakage-current MOSFETs.

12. The level shifter of claim 3, wherein the input circuitry is coupled to a first supply voltage for powering circuitry external to a first level shifter of the first voltage domain, and
wherein the output circuitry is coupled to a second supply voltage for powering circuitry external to a second level shifter of the second voltage domain, and wherein the reference voltage (Vss) is a ground voltage.

13. The level shifter of claim 12, wherein the firewall enable signal is a signal of the second voltage domain, and
wherein when the firewall enable signal is asserted, the circuitry external to the first level shifter of the first voltage domain is in a standby mode, the input circuitry no longer receives power from the first supply voltage, and the level shifter provides an output signal having a predetermined valid state.

14. The level shifter of claim 12, wherein when the firewall enable signal is asserted, the circuitry external to the second level shifter of the second voltage domain is in a standby mode, the output circuitry no longer receives power from the second supply voltage, and the level shifter provides an output signal having a predetermined valid state.

15. A method to reduce leakage current and provide firewall protection between circuits of different voltage domains when one voltage domain is in a standby mode comprising:
controlling coupling between input circuitry that receives input data and a reference voltage in response to a firewall enable signal;
translating signals between a first voltage domain and a second voltage domain when the firewall enable signal is deasserted; and generating an output signal having a predetermined one of either a high or low state that is independent of the input data when the firewall enable signal is asserted.

16. The method of claim 15, controlling the coupling further comprises:
decoupling the input circuitry from the reference voltage to reduce leakage current in the input circuitry when the firewall enable signal is asserted.

17. The method of claim 15, further comprising:
providing the output signal referenced to the second voltage domain at least when the firewall enable signal is deasserted; and
asserting a predetermined signal level at an intermediate node to cause an output stage to generate the output signal having the predetermined one of either a high or low state when the firewall enable signal is asserted.

18. The method of claim 15, further comprising:
coupling data signal switching elements to voltage translation switching elements when the firewall enable signal is deasserted;
decoupling the data signal switching elements from the voltage translation switching elements when the firewall enable signal is asserted to reduce leakage current in the voltage translation switching elements; and
decoupling the input circuitry from the reference voltage when the firewall enable signal is asserted to reduce leakage current in the input circuitry.

19. An integrated circuit comprising:
first voltage domain circuitry; and
one or more level shifters with integrated firewalls to translate signals between the first voltage domain circuitry and second voltage domain circuitry, wherein the one or more level shifters include:
an input stage for receiving input data including input circuitry and an input stage firewall switching element, the input stage firewall switching element to control the coupling between the input circuitry and a reference voltage in response to a firewall enable signal; and
a voltage translator stage to translate signals between a first voltage domain and a second voltage domain, the voltage translator stage including a firewall assertion switching element to cause the level shifter to generate an output signal having a predetermined one of either a high or low state that is independent of the input data when the firewall enable signal is asserted,
wherein when the firewall enable signal is asserted, either the first voltage domain circuitry or the second voltage domain circuitry is in a standby mode.

20. The integrated circuit of claim 19, further comprising:
a system controller to assert the firewall enable signal when placing the first voltage domain circuitry in a standby mode, and
wherein when the firewall enable signal is asserted, the input stage firewall switching element decouples the input circuitry from the reference voltage to reduce leakage current in the input circuitry.

21. The integrated circuit of claim 19, further comprising:
an output stage including output circuitry to provide the output signal referenced to the second voltage domain to the second voltage domain circuitry,
wherein the firewall assertion switching element asserts a predetermined signal level at an intermediate node to cause the output stage to generate the output signal having the predetermined one of either a high or low state when the firewall enable signal is asserted.

22. The integrated circuit of claim 19, wherein the voltage translator stage translates signals provided by the first voltage domain circuitry between the first voltage domain and the second voltage domain when the firewall enable signal is deasserted, and
wherein the voltage translator stage further includes firewall switching elements to couple data signal switching elements to voltage translation switching elements when the firewall enable signal is deasserted.

23. The integrated circuit of claim 22, wherein when the firewall enable signal is asserted, the firewall switching elements decouple the data signal switching elements from the voltage translation switching elements to reduce leakage current in the voltage translation switching elements, and
wherein when the firewall enable signal is asserted, the input stage firewall switching element decouples the input circuitry from the reference voltage to reduce leakage current in the input circuitry.

24. The integrated circuit of claim 19, further comprising:
third voltage domain circuitry;
one or more of the level shifters to translate signals between the first and third voltage domain circuitries; and
one or more of the level shifters to translate signals between the second and third voltage domain circuitries.

25. The integrated circuit of claim 19, wherein the first voltage domain circuitry includes a first cell having a first predetermined cell height, the second voltage domain circuitry includes a second cell having the first predetermined cell height, and the one or more level shifters includes cells having a second predetermined cell height,
wherein the second predetermined cell height is approximately twice the first predetermined cell height,
wherein the first voltage domain circuitry is positioned within a first integrated circuit between a first supply voltage rail and a reference voltage rail,
wherein the second voltage domain circuitry is positioned within a second integrated circuit between a second supply voltage rail and the reference voltage rail, and
wherein at least one of the level shifters is positioned within the integrated circuit between the first and second supply voltage rails and over the reference voltage rail.

26. The integrated circuit of claim 19, wherein the first voltage domain circuitry, the second voltage domain circuitry and the level shifters are fabricated on a single integrated circuit.

27. A machine-readable medium that provides instructions, which when executed by a processor, cause the processor to perform operations comprising:
controlling coupling between input circuitry that receives input data and a reference voltage in response to a firewall enable signal;
translating signals between a first voltage domain and a second voltage domain when the firewall enable signal is deasserted; and
generating an output signal having a predetermined one of either a high or low state that is independent of the input data when the firewall enable signal is asserted.

28. The machine-readable medium of claim 27, wherein the instructions, when further executed by the processor cause the processor to perform operations further comprising:
decoupling the input circuitry from the reference voltage to reduce leakage current in the input circuitry when the firewall enable signal is asserted.

29. The machine-readable medium of claim 27, wherein the instructions, when further executed by the processor cause the processor to perform operations further comprising:

providing the output signal referenced to the second voltage domain at least when the firewall enable signal is deasserted; and asserting a predetermined signal level at an intermediate node to cause an output stage to generate the output signal having the predetermined one of either a high or low state when the firewall enable signal is asserted.

30. The machine-readable medium of claim 27, wherein the instructions, when further executed by the processor cause the processor to perform operations further comprising:

coupling data signal switching elements to voltage translation switching elements when the firewall enable signal is deasserted;

decoupling the data signal switching elements from the voltage translation switching elements when the firewall enable signal is asserted to reduce leakage current in the voltage translation switching elements; and decoupling the input circuitry from the reference voltage when the firewall enable signal is asserted to reduce leakage current in the input circuitry.

31. A circuit for level shifting signals between voltage domains, comprising:

an input stage for receiving input data;

an input stage firewall transistor to either couple or decouple an input inverter from a reference voltage in response to a firewall enable signal; and a firewall assertion transistor to generate an output signal having a predetermined one of either a high or low state that is independent of the input data when the firewall enable signal is asserted.

32. The circuit of claim 31, wherein when the firewall enable signal is asserted, the input stage firewall transistor decouples the input inverter from the reference voltage to reduce leakage current in the input inverter.

33. The circuit of claim 31, further comprising:

an output stage inverter to provide the output signal referenced to a second voltage domain, wherein the firewall assertion transistor asserts a predetermined signal level at an intermediate node to cause the output stage inverter to generate the output signal having the predetermined state when the firewall enable signal is asserted.

34. The circuit of claim 31, further comprising:

a voltage translator stage to translate signals between a first voltage domain and a second voltage domain when the firewall enable signal is deasserted, the voltage translator stage including the firewall assertion transistor, wherein the voltage translator stage further includes firewall transistors to couple data signal transistors to back-to-back coupled voltage translation transistors when the firewall enable signal is deasserted.

35. The circuit of claim 34, wherein when the firewall enable signal is asserted, the firewall transistors decouple the data signal transistors from the voltage translation transistors to reduce leakage current in the voltage translation transistors, and wherein when the firewall enable signal is asserted, the input stage firewall transistor decouples the input inverter from the reference voltage to reduce leakage current in the input inverter.

* * * * *